(12) United States Patent
Ou et al.

(10) Patent No.: US 8,659,072 B2
(45) Date of Patent: Feb. 25, 2014

(54) SERIES FINFET IMPLEMENTATION SCHEMES

(75) Inventors: Chiung-Ting Ou, Hsin-Chu (TW); Chih-Chiang Chang, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 12/890,084

(22) Filed: Sep. 24, 2010

(65) Prior Publication Data

US 2012/0074495 A1 Mar. 29, 2012

(51) Int. Cl.
*H01L 29/732* (2006.01)

(52) U.S. Cl.
USPC ........................................................ 257/328

(58) Field of Classification Search
USPC ...................... 257/213, 288, 327, 328, E21.4, 257/E21.409, E21.41, E29.242, E29.255, 257/E29.262
See application file for complete search history.

(56) References Cited

U.S. PATENT DOCUMENTS

| | | | |
|---|---|---|---|
| 6,662,350 B2 | 12/2003 | Fried et al. | |
| 6,706,571 B1 | 3/2004 | Yu et al. | |
| 6,858,478 B2 | 2/2005 | Chau et al. | |
| 7,105,894 B2 | 9/2006 | Yeo et al. | |
| 7,190,050 B2 | 3/2007 | King et al. | |
| 7,247,887 B2 | 7/2007 | King et al. | |
| 7,262,086 B2 | 8/2007 | Yeo et al. | |
| 7,265,008 B2 | 9/2007 | King et al. | |
| 7,315,994 B2 | 1/2008 | Aller et al. | |
| 7,378,710 B2* | 5/2008 | Breitwisch et al. | ........... 257/347 |
| 7,508,031 B2 | 3/2009 | Liu et al. | |
| 7,528,465 B2 | 5/2009 | King et al. | |
| 7,605,449 B2 | 10/2009 | Liu et al. | |
| 7,795,907 B1* | 9/2010 | Wang | ............... 326/36 |
| 7,871,876 B2* | 1/2011 | Anderson et al. | ............. 438/198 |
| 8,114,723 B2* | 2/2012 | Gopalakrishnan et al. | ... 438/151 |
| 2005/0029556 A1* | 2/2005 | Wang et al. | .................... 257/250 |
| 2005/0153490 A1 | 7/2005 | Yoon et al. | |
| 2007/0047357 A1 | 3/2007 | Choi et al. | |
| 2007/0114612 A1* | 5/2007 | Ahn et al. | ...................... 257/364 |
| 2007/0120156 A1 | 5/2007 | Liu et al. | |

(Continued)

FOREIGN PATENT DOCUMENTS

| | | | | |
|---|---|---|---|---|
| CN | | 1525530 A | 9/2004 | |
| CN | | 101542390 | 9/2009 | |
| WO | WO 2009122353 A1 * | | 10/2009 | .......... H01L 21/8244 |

OTHER PUBLICATIONS

Nackaerts et al., "A 0.314 um2 6T-SRAM Cell build with Tall Triple-Gate Devices for 45nm node applications using 0.75NA 193nm lithographry", IEEE (2004): pp. 269-272.*

*Primary Examiner* — Michele Fan
(74) *Attorney, Agent, or Firm* — Slater & Matsil, L.L.P.

(57) ABSTRACT

A device includes a first semiconductor fin, and a second semiconductor fin parallel to the first semiconductor fin. A straight gate electrode is formed over the first and the second semiconductor fins, and forms a first fin field-effect transistor (FinFET) and a second FinFET with the first and the second semiconductor fins, respectively, wherein the first and the second FinFETs are of a same conductivity type. A first electrical connection is formed on a side of the straight gate electrode and coupling a first source/drain of the first FinFET to a first source/drain of the second FinFET, wherein a second source/drain of the first FinFET is not connected to a second source/drain of the second FinFET.

10 Claims, 6 Drawing Sheets

(56) References Cited

U.S. PATENT DOCUMENTS

| | | | |
|---|---|---|---|
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0171700 A1* | 7/2007 | Burnett et al. | 365/154 |
| 2007/0194833 A1* | 8/2007 | Takeyama et al. | 327/434 |
| 2007/0228426 A1* | 10/2007 | Iriguchi | 257/288 |
| 2008/0079077 A1* | 4/2008 | Takeda et al. | 257/351 |
| 2008/0144413 A1* | 6/2008 | Barasinski et al. | 365/203 |
| 2008/0273382 A1* | 11/2008 | Wang | 365/181 |
| 2008/0277729 A1* | 11/2008 | Gossner et al. | 257/360 |
| 2008/0277739 A1* | 11/2008 | Curatola | 257/393 |
| 2008/0283925 A1* | 11/2008 | Berthold et al. | 257/368 |
| 2008/0290470 A1 | 11/2008 | King et al. | |
| 2008/0296632 A1 | 12/2008 | Moroz et al. | |
| 2008/0303593 A1* | 12/2008 | Knoblinger | 330/277 |
| 2008/0308850 A1* | 12/2008 | Berthold et al. | 257/288 |
| 2009/0026523 A1* | 1/2009 | Wong et al. | 257/316 |
| 2009/0090976 A1* | 4/2009 | Kavalieros et al. | 257/369 |
| 2009/0095989 A1* | 4/2009 | Kim | 257/259 |
| 2009/0101940 A1* | 4/2009 | Barrows et al. | 257/204 |
| 2009/0127592 A1* | 5/2009 | El-Kareh et al. | 257/262 |
| 2009/0174000 A1* | 7/2009 | Ohguro | 257/368 |
| 2009/0181477 A1 | 7/2009 | King et al. | |
| 2009/0230483 A1* | 9/2009 | Mizumura et al. | 257/401 |
| 2009/0309162 A1* | 12/2009 | Baumgartner et al. | 257/368 |
| 2010/0006945 A1* | 1/2010 | Merelle et al. | 257/368 |
| 2010/0025766 A1* | 2/2010 | Nuttinck et al. | 257/351 |
| 2010/0025767 A1* | 2/2010 | Inaba | 257/365 |
| 2010/0032671 A1* | 2/2010 | Marshall | 257/48 |
| 2010/0052025 A1* | 3/2010 | Tigelaar et al. | 257/298 |
| 2010/0219483 A1* | 9/2010 | Masuoka et al. | 257/369 |
| 2010/0224943 A1* | 9/2010 | Kawasaki | 257/390 |
| 2011/0018064 A1* | 1/2011 | Doornbos | 257/365 |
| 2011/0024828 A1* | 2/2011 | Takeuchi | 257/329 |
| 2011/0068399 A1* | 3/2011 | Bryant et al. | 257/347 |
| 2011/0068414 A1* | 3/2011 | Anderson et al. | 257/401 |
| 2011/0317477 A1* | 12/2011 | Liaw | 365/156 |

* cited by examiner

SERIES FINFET IMPLEMENTATION SCHEMES

BACKGROUND

In integrated circuits, weak transistors that have smaller drive currents than other transistors on the same chip, are sometimes needed. To form a weak transistor, two or more transistors of the same conductivity type may be connected in series, with the source of one of the transistors connected to the drain of the other transistor.

The layout of the two transistors that form the weak transistor typically include a rectangular active region. Two gate electrodes are formed over the active region and parallel to each other, and form two transistors with the underlying portions of the rectangular active region. The gate electrodes may be interconnected through a connecting portion that is not directly over the active region. Accordingly, the connected gate electrodes in combination form the gate electrode of the weak transistor, and the active region on outer sides of the gate electrodes form the source and drain regions of the series transistor. The portion of the active region is shared by two transistors as the common source/drain region.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel series fin field-effect transistor (FinFET) is presented in accordance with an embodiment. The variations of the embodiments are discussed. Throughout the various views and illustrative embodiments, like reference numbers are used to designate like elements.

Figure 1A:
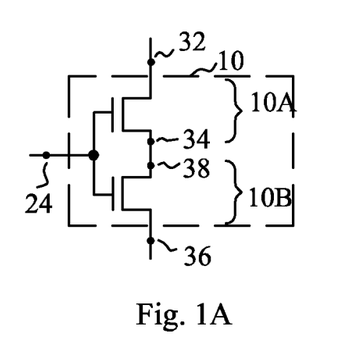
FIGS. 1A and 1B illustrate circuit diagrams of an n-type series fin field-effect transistor (FinFET) and a p-type series FinFET, respectively.
Figure 1B:
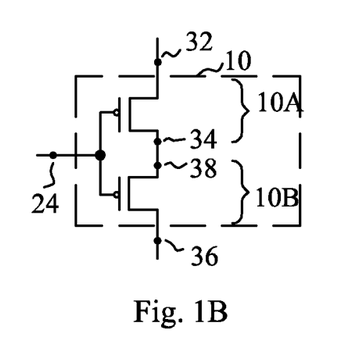

FIG. 1A illustrates a circuit diagram of series n-type Fin-FET 10, which includes gate 24 and source and drain regions (referred to as source/drain regions hereinafter) 32 and 36. Series FinFET 10 includes FinFETs 10A and 10B having their source-to-drain paths connected in series. FinFET 10A includes gate 24 and source/drain regions 32 and 34. FinFET 10B includes gate 24 and source/drain regions 36 and 38. Source/drain regions 34 and 38 are coupled together. Accordingly, FinFETs 10A and 10B in combination may be used as a single FinFET, which is weaker (with a smaller drive current) than each of FinFETs 10A and 10B. FIG. 1B illustrates the circuit diagram of p-type series FinFET 10, wherein like elements in FIG. 1B are denoted using like reference notations as in FIG. 1A.

Figure 2A:
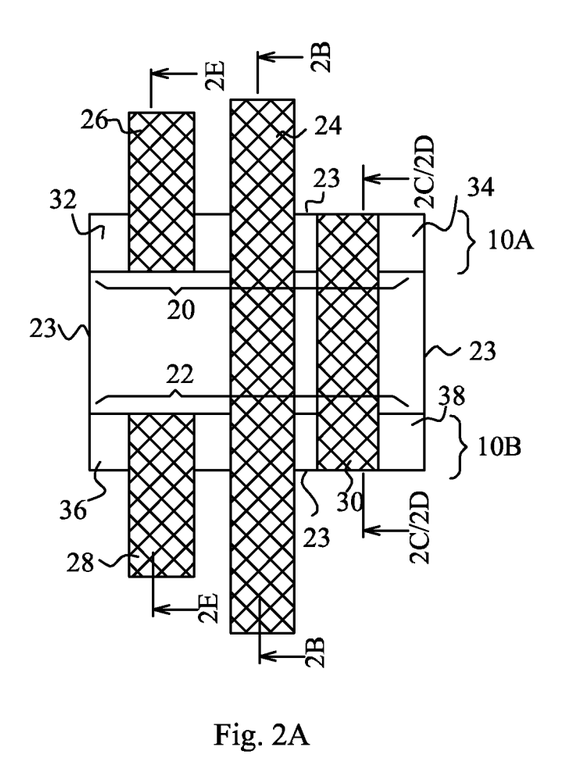
FIG. 2A illustrates a layout of a series FinFET in accordance with an embodiment.

FIG. 2A illustrates a layout of FinFET 10 as shown in FIGS. 1A and 1B. Semiconductor fins 20 and 22 are allocated in parallel. In an embodiment, outer boundaries of semiconductor fins 20 and 22, when viewed from top, may define rectangular region 23. Gate electrode 24, which may be a straight gate electrode, is formed over and crossing semiconductor fins 20 and 22, hence forming FinFETs 10A and 10B, respectively. Source/drain regions 32, 34, 36, and 38, which may be parts of semiconductor fins, of FinFETs 10A and 10B, are marked using notations corresponding to what are used in FIGS. 1A and 1B. Source/drain regions 32, 34, 36, and 38 are of the same conductivity type themselves.

Electrical connection 30 is formed to interconnect source/drain regions 34 and 38 that are on the same side of gate electrode 24. In the top view, the longitudinal direction of electrode connection 30 may be parallel to the longitudinal direction of gate electrode 24. Electrical connection 30 may form a straight line in the top view. Electrical connections 26 and 28 are formed, and are electrically coupled to source/drain regions 32 and 36, respectively. Electrical connections 26 and 28 are disconnected from each other.

Figure 2B:
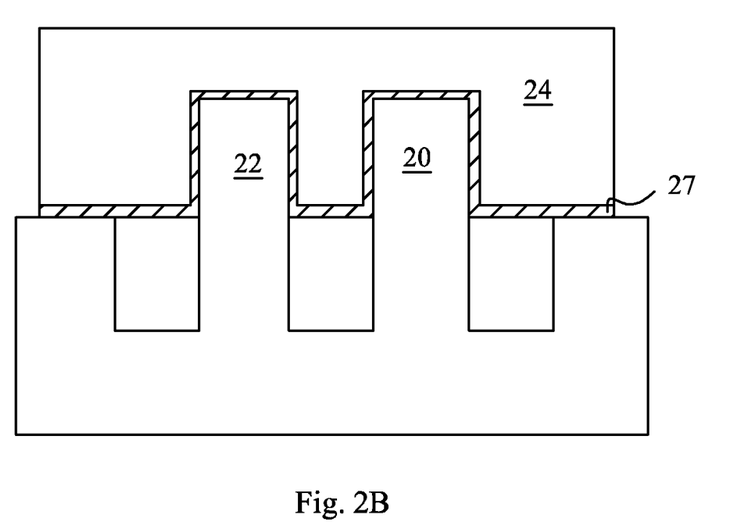
FIGS. 2B through 2E are cross-sectional views of the series FinFET in FIG. 2A.

FIG. 2B illustrates a cross-sectional view of the structure shown in FIG. 2A, wherein the cross-sectional view is obtained from the plane crossing line 2B-2B in FIG. 2A. Gate dielectric(s) 27 are formed between gate electrode 24 and fins 20 and 22. If FinFET 10 is an n-type FinFET as shown in FIG. 1A, the portions (as illustrated) of fins 20 and 22 forming the channels of FinFETs 10A and 1B are both of p-type. Otherwise, if FinFET 10 is a p-type FinFET as shown in FIG. 1B, the portions of fins 20 and 22 forming the channels of FinFETs 10A and 1B are both of n-type. As shown in FIG. 2B, each of FinFETs 10A and 10B (also refer to FIG. 2A ma be a tri-gate FinFET which includes two gates on opposite sides of the respective fins 20 and 22, and a gate over the respective fins 20 and 22. The three gates of each of FinFETs 10A and 10B are interconnected, and are portions of the continuous gate electrode 24.

Figure 2C:
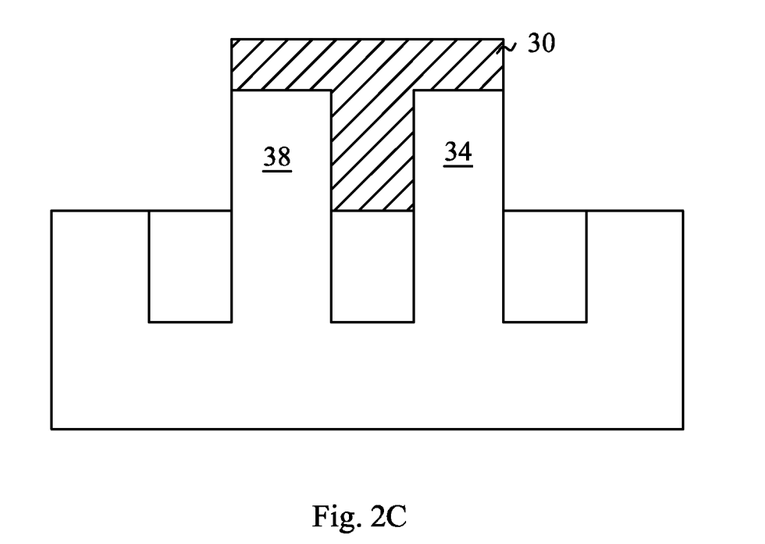
Figure 2D:
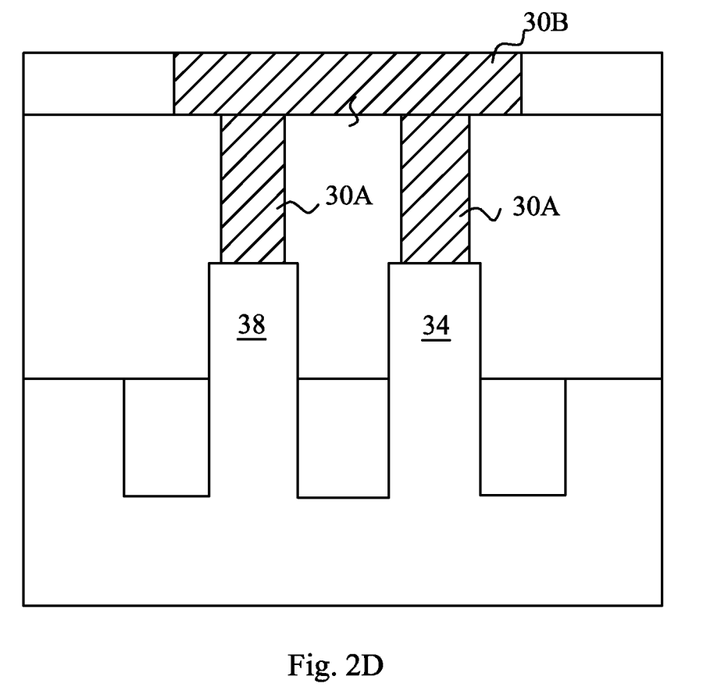

FIGS. 2C and 2D illustrate exemplary cross-sectional views of the structure shown in FIG. 2A, wherein the cross-sectional views are obtained from the plane crossing line 2C/2D-2C/2D in FIG. 2A. In FIG. 2C, electrical connection 30 includes a butted contact plug (also denoted as 30), which contacts both source/drain regions 34 and 38, and extends into the gap between source/drain regions 34 and 38. Although not shown, each of source/drain regions 34 and 38 may include a semiconductor region, and a silicide region over the semiconductor region. In FIG. 2D, electrical connection 30 includes contact plugs 30A directly over the respective source/drain regions 34 and 38, and metal line 30B connecting contact plugs 30A.

Figure 2E:
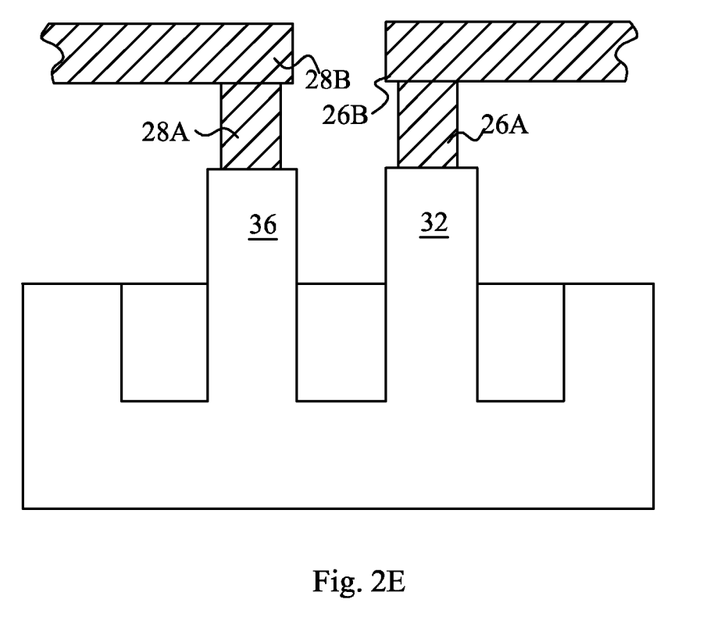

FIG. 2E illustrates an exemplary cross-sectional view of the structure shown in FIG. 2A, wherein the cross-sectional views are obtained from the plane crossing line 2E-2E in FIG. 2A. Electrical connections 26 and 28 are physically separated from each other and electrically decoupled from each other. Each of connections 26 and 28 may include a contact plug 26A/28A and a connecting metal line 26B/28B, although connections 26 and 28 may have different structures.

Figure 3:
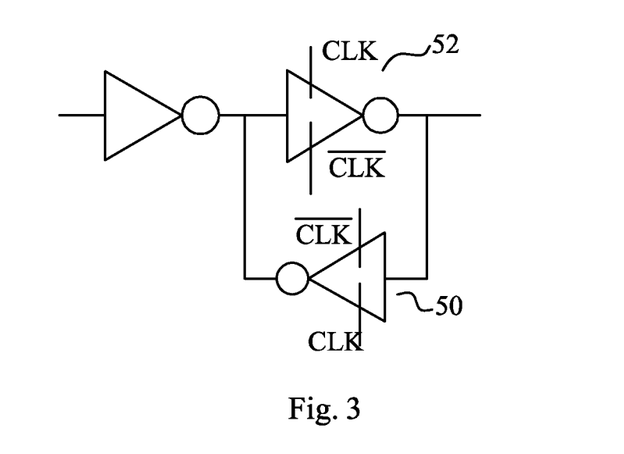
FIGS. 3 through 6 illustrate applications of the series FinFET.
Figure 4:
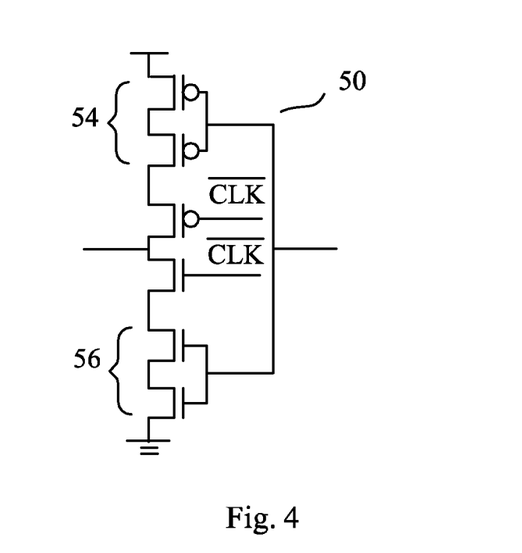

FIG. 3 illustrates a feedback latch comprising the device shown in FIGS. 1A through 2E. Clock-gated inverter 50 may be formed using weak transistors 54 and 56 (not shown in FIG. 3, please refer to FIG. 4), which are weaker than the transistors (not shown) in clock-gated inverter 52. An exemplary circuit diagram of clock-gated inverter 50 is shown in FIG. 4. Each of transistors 54 and 56 comprises two serially coupled transistors and may have the same structure as series transistor 10, as shown in FIGS. 1A through 2E.

Figure 5:
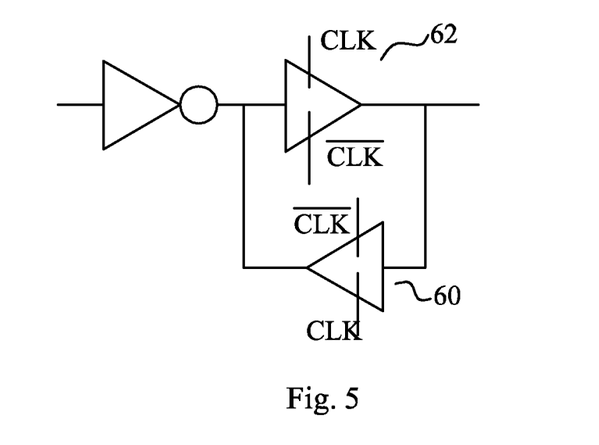
Figure 6:
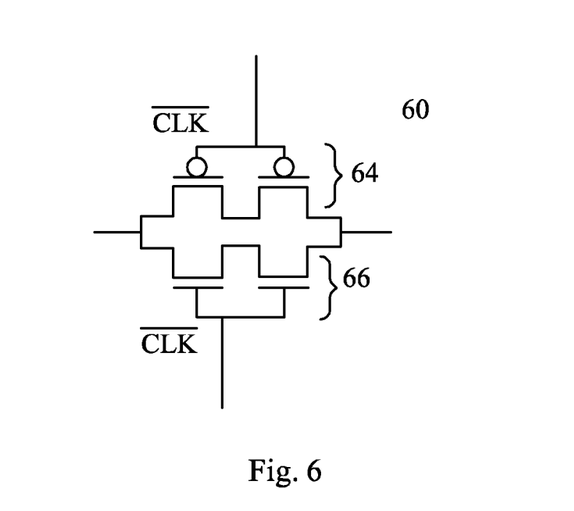

FIG. 5 illustrates an alternative feedback latch. Clock-gated transmission gate 60 may be formed using weak transistors 64 and 66 (not shown in FIG. 5, please refer to FIG. 6), which are weaker than the transistors (not shown) in clock-gated transmission gate 62. An exemplary circuit diagram of clock-gated transmission gate 60 is shown in FIG. 6. Each of transistors 64 and 66 comprises two serially coupled transistors and may have the same structure as series transistor 10 as shown in FIGS. 1A through 2E.

Figure 7A:
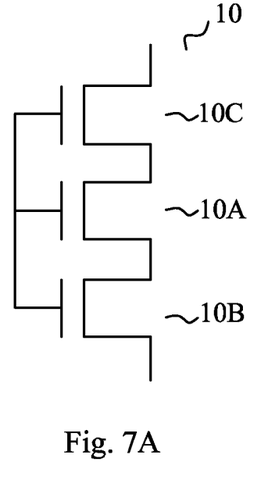
FIGS. 7A and 7B illustrate circuit diagrams of a series FinFET comprising three FinFETs connected in series.
Figure 7B:
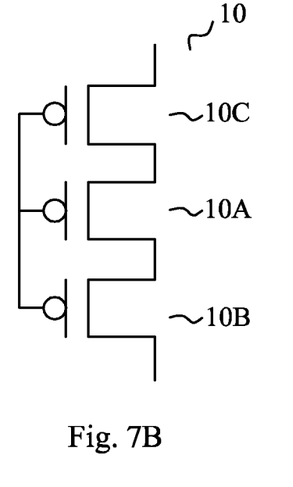
Figure 8:
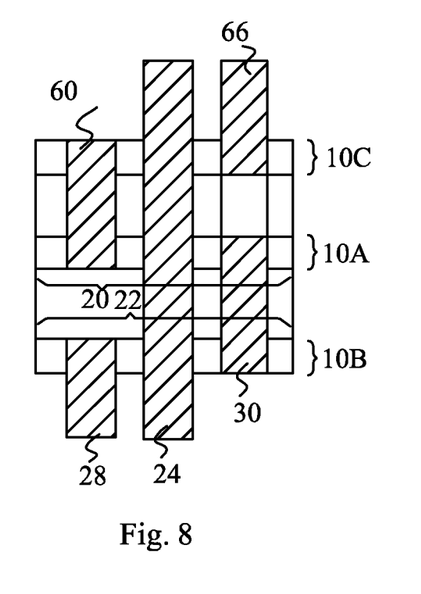
FIG. 8 is a layout of the series FinFET in FIG. 7A or 7B.

FIGS. 7A and 7B illustrate the circuit diagram of series FinFETs, with each comprising three FinFETs. In each of FIGS. 7A and 7B, the source-to-drain paths of FinFETs 10A, 10B, and 10C are connected in series to form a single series transistor 10. FIG. 7A illustrates a serial n-type FinFET, while FIG. 7B illustrates a serial p-type FinFET. The layout of series FinFET transistor 10 is illustrated in FIG. 8. It is observed that each of electrical connections 30 and 60 is used to interconnect source/drain regions on the same side of gate electrode 24. In the top view, the longitudinal directions of electrode connections 30 and 60 may be parallel to the longitudinal direction of gate electrode 24. Electrical connections 28 and 66, which may be essentially the same as electrical connections 26 and 28 in FIG. 2A, are also formed, and are electrically disconnected from each other. Although FIGS. 7A through 8 illustrate serial FinFETs formed of three FinFETs, one skilled in the art will be able to form serial FinFETs comprising more FinFETs by applying the teaching of the present disclosure.

In the embodiments, by arranging active regions parallel to each other, and using a same gate electrode to cross the active regions to form a series FinFET, the chip area may be saved. With a series FinFET comprising two FinFETs, the chip area is only ⅔ the chip area of a series FinFET formed using conventional schemes. If more FinFETs are included in a series FinFET, the save in chip area is even greater.

In accordance with an embodiment, a device includes a first semiconductor fin, and a second semiconductor fin parallel to the first semiconductor fin. A straight gate electrode is formed over the first and the second semiconductor fins, and forms a first FinFET and a second FinFET with the first and the second semiconductor fins, respectively, wherein the first and the second FinFETs are of a same conductivity type. A first electrical connection is formed on a side of the straight gate electrode and coupling a first source/drain of the first FinFET to a first source/drain of the second FinFET, wherein a second source/drain of the first FinFET is not connected to a second source/drain of the second FinFET.

In accordance with other embodiments, a device includes a series FinFET, which includes a first semiconductor fin; a second semiconductor fin parallel to the first semiconductor fin, with outer boundaries of the first and the second semiconductor fin defining a first rectangular region in a top view of the series FinFET; a first and a second gate dielectric on top surfaces and sidewalls of the first and the second semiconductor fins; a gate electrode over the first and the second semiconductor fins and separated from the first and the second semiconductor fins by the first and the second gate dielectrics, respectively; and a first electrical connection on a side of the gate electrode and interconnecting portions of the first and the second semiconductor fins not covered by the gate electrode.

In accordance with yet other embodiments, a device includes a series FinFET including a first, a second, and a third semiconductor fin parallel to each other; and a straight gate electrode perpendicular to the first, the second, and the third semiconductor fins, and forming a first, a second, and a third FinFET of a same conductivity type with the first, the second, and the third semiconductor fins, respectively. A first electrical connection is formed on a first side of the straight gate electrode and interconnecting a first source/drain of the first FinFET to a first source/drain of the second FinFET. A second electrical connection is formed on a second side of the straight gate electrode and connecting a second source/drain of the second FinFET to a second source/drain of the third FinFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a first semiconductor fin;
   a second semiconductor fin parallel to the first semiconductor fin;
   a straight gate electrode over the first and the second semiconductor fins, and forming a first fin field-effect transistor (FinFET) and a second FinFET with the first and the second semiconductor fins, respectively, wherein the first and the second FinFETs are of a same conductivity type, and wherein the straight gate electrode continuously extends from the first semiconductor fin to the second semiconductor fin; and
   a first electrical connection on a side of the straight gate electrode and coupling a source of the first FinFET to a drain of the second FinFET, wherein a drain of the first FinFET is not connected to a source of the second FinFET.

2. The device of claim 1, wherein the first electrical connection has a longitudinal direction parallel to a longitudinal direction of the straight gate electrode.

3. The device of claim 1, wherein the first and the second FinFETs are n-type FinFETs.

4. The device of claim 1, wherein the first and the second FinFETs are p-type FinFETs.

5. The device of claim 1, wherein the first and second FinFETs form a series FinFET.

6. The device of claim 1 further comprising:
   a third semiconductor fin parallel to the first and the second semiconductor fins, wherein the straight gate electrode continuously extends over the third semiconductor fin to form a third FinFET of the same conductivity type as the first and the second FinFETs; and a second electrical connection connecting the source of the second FinFET to a drain of the third FinFET, wherein a source of the third FinFET is not connected to the drain of the first FinFET.

7. The device of claim 6, wherein the first, the second, and the third FinFETs form a series FinFET.

8. The device of claim 1, wherein the first electrical connection comprises:

a first contact plug directly over and connected to the source of the first FinFET;

a second contact plug directly over and connected to the drain of the second FinFET; and a metal line over and connected to the first and the second contact plugs.

9. The device of claim 1, wherein the first two first gates on opposite sides of the first semiconductor fin, with the two first gates electrically interconnected, and wherein the second FinFET comprises two second gates on opposite sides of the second semiconductor fin, with the two second gates electrically interconnected.

10. The device of claim 9, wherein the first FinFET further comprises a third gate over the first semiconductor fin, wherein the second FinFET further comprises a fourth gate over the second semiconductor fin, and wherein the two first gates, the two second gates, the third gate, and the fourth gate are interconnected, and are portions of the straight gate electrode.

* * * * *

UNITED STATES PATENT AND TRADEMARK OFFICE
CERTIFICATE OF CORRECTION

PATENT NO. : 8,659,072 B2  
APPLICATION NO. : 12/890084  
DATED : February 25, 2014  
INVENTOR(S) : Chiung-Ting Ou et al.

Page 1 of 1

It is certified that error appears in the above-identified patent and that said Letters Patent is hereby corrected as shown below:

In the Claims:

In Col. 5, line 17, claim 9, after "wherein the first" insert --FinFET comprises--.

Signed and Sealed this  
Sixth Day of May, 2014

Michelle K. Lee  
*Deputy Director of the United States Patent and Trademark Office*